United States Patent
Howe (10) Patent No.: US 12,297,098 B2
(45) Date of Patent: May 13, 2025

(54) SYSTEMS AND METHODS FOR TEMPERATURE SENSOR ACCESS IN DIE STACKS

(71) Applicant: Micron Technology, Inc., Boise, ID (US)

(72) Inventor: Gary L. Howe, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 1342 days.

(21) Appl. No.: 15/824,559

(22) Filed: Nov. 28, 2017

(65) Prior Publication Data

US 2019/0161341 A1 May 30, 2019

(51) Int. Cl.
*B81B 7/00* (2006.01)
*B81C 1/00* (2006.01)
*G11C 11/56* (2006.01)

(52) U.S. Cl.
CPC ........ *B81B 7/0087* (2013.01); *B81C 1/00301* (2013.01); *G11C 11/5642* (2013.01); *B81B 2201/0278* (2013.01)

(58) Field of Classification Search
CPC ........................................................ B81B 7/00
See application file for complete search history.

(56) References Cited

U.S. PATENT DOCUMENTS

| | | | |
|---|---|---|---|
| 2007/0189355 A1* | 8/2007 | Lorenz ................... | G01K 15/00 374/1 |
| 2016/0162219 A1* | 6/2016 | Erez ........................ | G11C 8/12 711/103 |
| 2016/0300816 A1* | 10/2016 | Park ........................ | H01L 23/34 |
| 2017/0255403 A1* | 9/2017 | Sharon ................. | G11C 11/5642 |
| 2017/0287876 A1* | 10/2017 | Park ........................ | H01L 25/18 |

* cited by examiner

*Primary Examiner* — Marvin Payen
(74) *Attorney, Agent, or Firm* — Fletcher Yoder, P.C.

(57) ABSTRACT

A memory device may include a memory array including a plurality of memory cells and a die stack including at least a portion of the plurality of memory cells. The memory device may also include multiple temperature sensors each designed to output a temperature code corresponding to the temperature of a respective die of the die stack. One die of the die stack is then designed to output the temperature code corresponding to the hottest die of the die stack.

11 Claims, 6 Drawing Sheets

| Temperature Code | Refresh Rate |
| --- | --- |
| 000 | Cold Temp. Reference |
| 001 | 4x |
| 010 | 2x |
| 011 | 1x Normal |
| 100 | 0.5x |
| 101 | 0.25x |
| 110 | 0.25x |
| 111 | Exceeds High Temp. Range |

SYSTEMS AND METHODS FOR TEMPERATURE SENSOR ACCESS IN DIE STACKS

BACKGROUND

Embodiments described herein relate generally to the field of memory devices. More specifically, the current embodiments include one or more systems, devices, and methods for accessing temperature sensor data in a die stack.

DESCRIPTION OF RELATED ART

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Memory devices (e.g., dynamic random access memory (DRAM)) may employ periodic refreshing of data in the memory cells. Depending on the temperature of the die in the memory device, refresh rates may be increased or decreased. In 3-dimensional stacking (3DS) die, a temperature sensor on the master die may be used to adjust the refresh rate. However, the master die may or may not be the hottest die in the stack, and, therefore, adjustments to the refresh rate may not be optimal. Accordingly, embodiments described herein may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

In general, memory arrays in computing systems may be dynamic random-access memory (DRAM), static random-access memory (SRAM), a combination or variant thereof, or any other suitable type of memory device. In some embodiments, the memory array may be made up of multiple die on which the logical data is stored. Furthermore, in some embodiments, the die may be stacked on top of one another, for example using 3-dimensional stacking (3DS). Each die may also have a temperature sensor, since each die (e.g., in a stack) may not operate at the same temperature. In general, the temperature of a die may affect the operational properties of the die. As such, parameters of operation of the die (e.g., refresh rate) may be changed based on the observed temperatures.

The memory cells of the memory array, for example, in DRAM, may be refreshed (i.e., read and/or rewritten) periodically to maintain integrity of the logical data. In some instances, current leakage to/from a memory cell may cause the memory cell to change the value of the logical data. In turn, this may cause errors in the computing system. Writing or rewriting the logical data to the memory cells periodically may help maintain the values of the logical data. In some cases, a hotter die temperature may increase the current leakage. As such, the refresh rate of the memory cells may be increased (i.e., the memory cells may be refreshed more often) in response to determining an increased die temperature.

In general, the master die of a die stack may be the hottest die in the stack. As such, in one embodiment, the master die may be the only die with a temperature sensor and/or the only temperature read when updating the refresh rate of the die stack. However, in some instances, the master die may not be the hottest die in a die stack. As such, updating the refresh rate based on the hottest die in a stack may better maintain, with greater reliability, the logical values of the memory cells. For instance, in double data rate type five synchronous dynamic random-access memory (DDR5 SDRAM), a die stack may include compare logic to output to a controller (e.g., mode register) an indication of the hottest die temperature of the stack.

Figure 1:
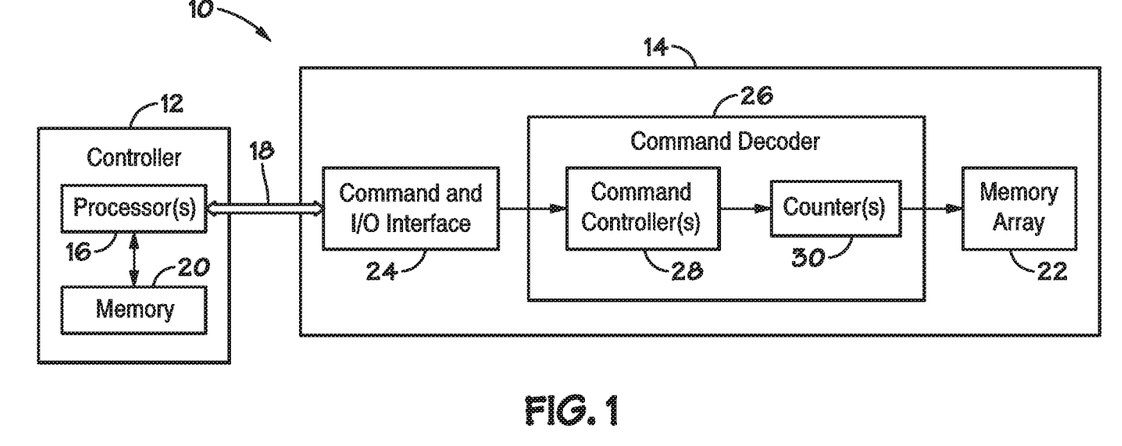
FIG. 1 is a block diagram illustrating a computer system, in accordance with an embodiment of the present disclosure.

Referring now to FIG. 1, a simplified block diagram of a computer system 10, which may provide for such sequential access of a memory device, is illustrated. The computer system 10 includes a controller 12 and a memory device 14. The controller 12 may include processing circuitry, such as one or more processors 16 (e.g., one or more microprocessors), that may execute software programs to provide various signals to the memory device 14 over one or more bi-directional communication buses 18 to facilitate the transmission and receipt of data to be written to or read from the memory device 14. In some embodiments, the controller 12 may be and/or include a memory controller and regulate the operational settings (e.g., voltage, refresh rate, clock speed, etc.) of the memory device 14. Additionally, the controller 12 may be located on the memory device 14 or as a separate component of the computer system 10. The processor(s) 16 may include multiple microprocessors, one or more "general-purpose" microprocessors, one or more special-purpose microprocessors, and/or one or more application specific integrated circuits (ASICS), or some combination thereof.

For example, the processor(s) 16 may include one or more reduced instruction set (RISC) processors.

The processor(s) 16 may be coupled to one or more memories 20 that may store information such as control logic and/or software, look up tables, configuration data, etc. In some embodiments, the processor(s) 16 and/or the memory 20 may be external to the controller 12. The memory 20 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 20 may store a variety of information and may be used for various purposes. For example, the memory 20 may store machine-readable and/or processor-executable instructions (e.g., firmware or software) for the processor(s) 16 to execute, such as instructions for providing various signals and commands to the memory device 14 to facilitate the transmission and receipt of data to be written to or read from the memory device 14.

The memory device 14 includes a memory array 22 of individual memory cells. As described further below, the memory array 22 may include one or more memory banks that may be grouped or partitioned in a variety of ways to provide access to the cells of the memory array 22. Furthermore, the memory array 22 may be arranged in a three dimensional die stack as discussed further below. The controller 12 may communicate with the memory device 14 through one or more command and input/output (I/O) interfaces 24. In general, the command and input/output interfaces 24 provide access to various components of the memory device 14 by external devices, such as the controller 12.

The memory device 14 may include a command decoder 26. The command decoder 26 may receive command signals from the command and input/output (I/O) interfaces 24 and may decode the command signals to provide various internal commands. For instance, the command decoder 26 may decode commands, such as read commands, write commands, mode-register set commands, activate commands, etc., and provide access to specified regions of the memory array 22. Certain modes of operation, such as the refresh mode, may facilitate sequential access to individual cells of the memory array 22. To facilitate this functionality, the command decoder 26 includes a command controller 28 that includes one or more individual controllers to control the address sequencing when a particular mode command (e.g., refresh command, Fast Zero command, Error Check and Scrub command, etc.) is received. Further, in order to generate internal addresses to be accessed sequentially, one or more counters 30 may also be provided. Because additional counters 30 may increase the cost and/or size of the memory device 14, it may be advantageous, in some embodiments, to share the same counters 30 with multiple modes of operation to minimize the additional hardware used to generate the address sequencing to access the memory array 22. It should be noted that while the command controller 28 and counters 30 are illustrated as being part of the command decoder 26, alternatively, these elements may be provided elsewhere on the memory device 14.

Figure 2:
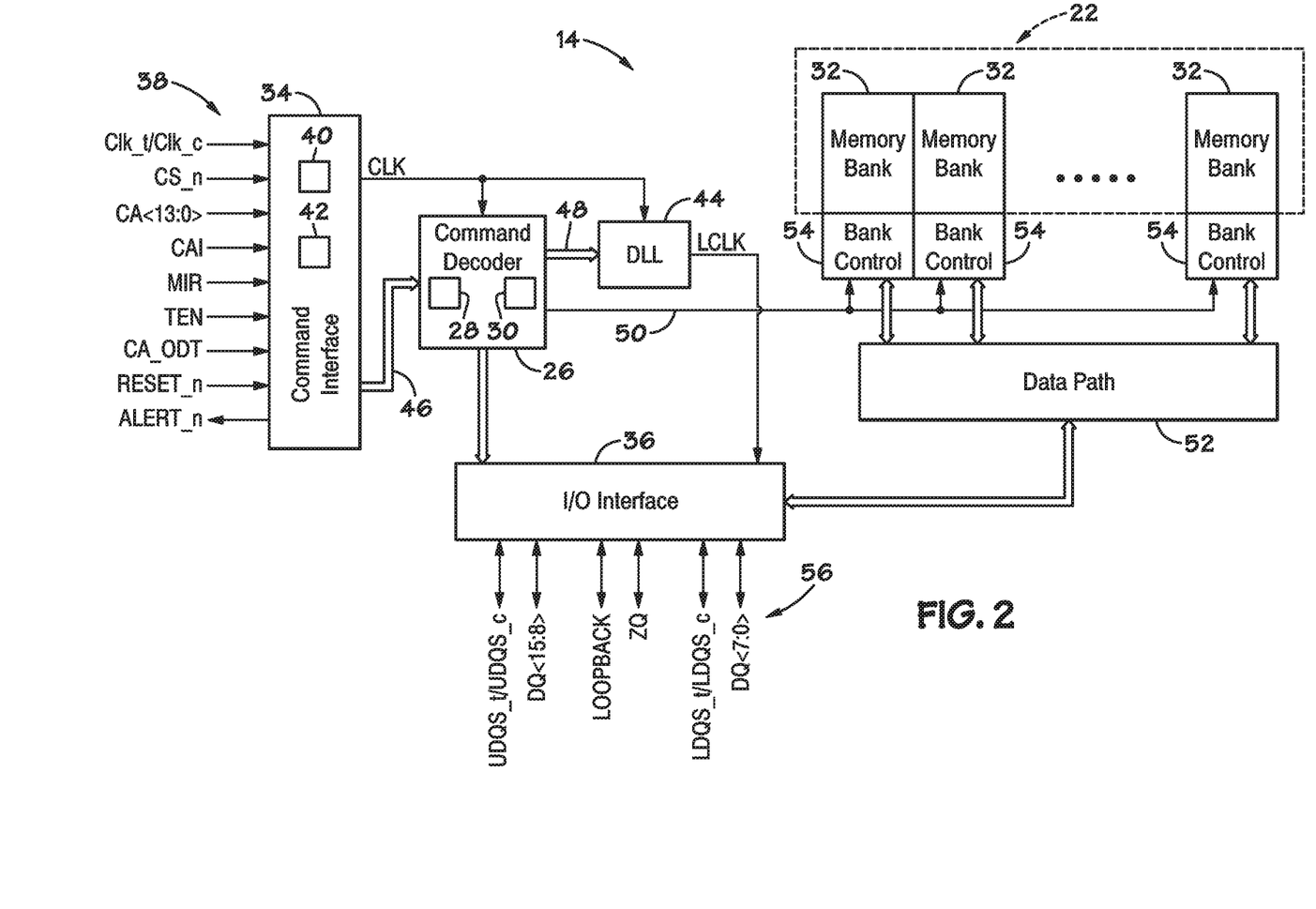
FIG. 2 is a block diagram illustrating a memory device, in accordance with an embodiment of the present disclosure.

The block diagram of FIG. 2 is a functional block diagram illustrating certain additional features and related functionality of the memory device 14. In accordance with one embodiment, the memory device 14 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 14, may include a memory array 22 logically and functionally grouped into a number of memory banks 32. The memory banks 32 may be DDR5 SDRAM memory banks, for instance. The memory banks 32 may be provided on one or more chips (e.g., SDRAM chips) that are arranged on dual inline memory modules (DIMMS). As stated above, the memory banks 32 may be included on 3DS stacked die. Each DIMM may include a number of SDRAM memory chips (e.g., ×8 or ×16 memory chips). Each SDRAM memory chip may include one or more memory banks 32. The memory device 14 represents a portion of a single memory chip (e.g., SDRAM chip) having a number of memory banks 32. For DDR5, the memory banks 32 may be further arranged to form bank groups. For instance, for an 8 gigabit (Gb) DDR5 SDRAM, the memory chip may include 16 memory banks 32, arranged into 8 bank groups, each bank group including 2 memory banks. For a 16 Gb DDR5 SDRAM, the memory chip may include 32 memory banks 32, arranged into 8 bank groups, each bank group including 4 memory banks, for instance. Various other configurations, organization and sizes of the memory banks 32 on the memory device 14 may be utilized depending on the application and design of the overall system.

As previously described, the memory device 14 may include a command interface 34 and an input/output (I/O) interface 36. The command interface 34 is configured to provide a number of signals (e.g., signals 38) from an external device, such as a processor 16 or controller 12. The processor 16 or controller 12 may provide various signals 38 over one or more bi-directional data buses (e.g., data bus 18) to and from the memory device 14 to facilitate the transmission and receipt of data to be written to or read from the memory device 14.

As will be appreciated, the command interface 34 may include a number of circuits, such as a clock input circuit 40 and a command address input circuit 42, for instance, to ensure proper handling of the signals 38. The command interface 34 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 40 receives the true clock signal (Clk_t) and the complementary clock signal (Clk_c) and generates an internal clock signal CLK. The internal clock signal CLK is supplied to an internal clock generator 44, such as a delay locked loop (DLL) circuit. The internal clock generator 44 generates a phase controlled internal clock signal LCLK based on the received internal clock signal CLK. The phase controlled internal clock signal LCLK is supplied to the I/O interface 36, for instance, and is used as a timing signal for determining an output timing of read data.

The internal clock signal CLK may also be provided to various other components within the memory device 14 and may be used to generate various additional internal clock signals. For instance, the internal clock signal CLK may be provided to a command decoder 26. The command decoder 26 may receive command signals from the command bus 50 and may decode the command signals to provide various internal commands. For instance, the command decoder 26 may provide command signals to the internal clock generator 44 over the bus 48 to coordinate generation of the phase controlled internal clock signal LCLK. The phase controlled internal clock signal LCLK may be used to clock data through the I/O interface 36, for instance.

Further, the command decoder 26 may decode commands, such as read commands, write commands, activate commands, mode-register set commands (e.g., temperature read commands, refresh commands, etc.), and provide access to a particular memory bank 32 corresponding to the command, via the bus path 52. As will be appreciated, the memory device 14 may include various other decoders, such as row decoders and column decoders, to facilitate access to the memory banks 32. In one embodiment, each memory bank 32 includes a bank control 54 which may provide the necessary decoding (e.g., row decoder and column decoder), as well as other features, such as timing control, refresh control, and data control, to facilitate the execution of commands to and from the memory banks 32.

As previously described with regard to FIG. 1, the command decoder 26 may include one or more command controllers 28 to facilitate certain functions. In addition, the command decoder 26 may include one or more counters 30 that may be utilized under control of the command controller(s) 28 to generate internal addresses for sequential access of cells of the individual storage locations within each memory bank 32. Such sequential access may be used, for example, when refreshing the memory cells of the memory device 14.

The memory device 14 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 34 using the clock signals (Clk_t and Clk_c). The command interface 34 may include a command address input circuit 42 which is configured to receive and transmit the commands to provide access to the memory banks 32, through the command decoder 26, for instance. In addition, the command interface 34 may receive a chip select signal (CS_n). The CS_n signal enables the memory device 14 to process commands on the incoming CA<13:0> bus. Access to specific banks 32 within the memory device 14 is encoded on the CA<13:0> bus with the commands.

In addition, the command interface 34 may be configured to receive a number of other command signals. For instance, a command/address on die termination (CA_ODT) signal may be provided to facilitate proper impedance matching within the memory device 14. A reset command (RESET_n) may be used to reset the command interface 34, status registers, state machines and the like, during power-up for instance. The command interface 34 may also receive a command/address invert (CAI) signal which may be provided to invert the state of command/address signals CA<13:0> on the command/address bus, for instance, depending on the command/address routing for the particular memory device 14. A mirror (MIR) signal may also be provided to facilitate a mirror function. The MIR signal may be used to multiplex signals so that they can be swapped for enabling certain routing of signals to the memory device 14, based on the configuration of multiple memory devices in a particular application. Various signals to facilitate testing of the memory device 14, such as the test enable (TEN) signal, may be provided, as well. For instance, the TEN signal may be used to place the memory device 14 into a test mode for connectivity testing.

The command interface 34 may also be used to provide an alert signal (ALERT_n) to the system processor or controller for certain errors that may be detected. For instance, an alert signal (ALERT_n) may be transmitted from the memory device 14 if a cyclic redundancy check (CRC) error is detected. Other alert signals may also be generated. Further, the bus and pin for transmitting the alert signal (ALERT_n) from the memory device 14 may be used as an input pin during certain operations, such as the connectivity test mode executed using the TEN signal, as described above.

Data may be sent to and from the memory device 14, utilizing the command and clocking signals discussed above, by transmitting and receiving data signals 56 through the I/O interface 36. More specifically, the data may be sent to or retrieved from the memory banks 32 over the data path 52, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 14, certain memory devices, such as DDR memory devices may utilize data strobe signals, generally referred to as DQS signals. The DQS signals are driven by the external processor or controller sending the data (e.g., for a write command) or by the memory device 14 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 14, for instance.

An impedance (ZQ) calibration signal may also be provided to the memory device 14 through the I/O interface 36. The ZQ calibration signal may be provided to a reference pin and used to tune output drivers and ODT values by adjusting pull-up and pull-down resistors of the memory device 14 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 14 and GND/VSS external to the memory device 14. This resistor acts as a reference for adjusting internal ODT and drive strength of the IO pins.

In addition, a loopback signal (LOOPBACK) may be provided to the memory device 14 through the I/O interface 36. The loopback signal may be used during a test or debugging phase to set the memory device 14 into a mode wherein signals are looped back through the memory device 14 through the same pin. For instance, the loopback signal may be used to set the memory device 14 to test the data output (DQ) of the memory device 14. Loopback may include both a data and a strobe or possibly just a data pin. This is generally intended to be used to monitor the data captured by the memory device 14 at the I/O interface 36.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 14), etc., may also be incorporated into the memory system 10. Accordingly, it should be understood that the block diagram of FIG. 2 is only provided to highlight certain functional features of the memory device 14 to aid in the subsequent detailed description.

Figure 3:
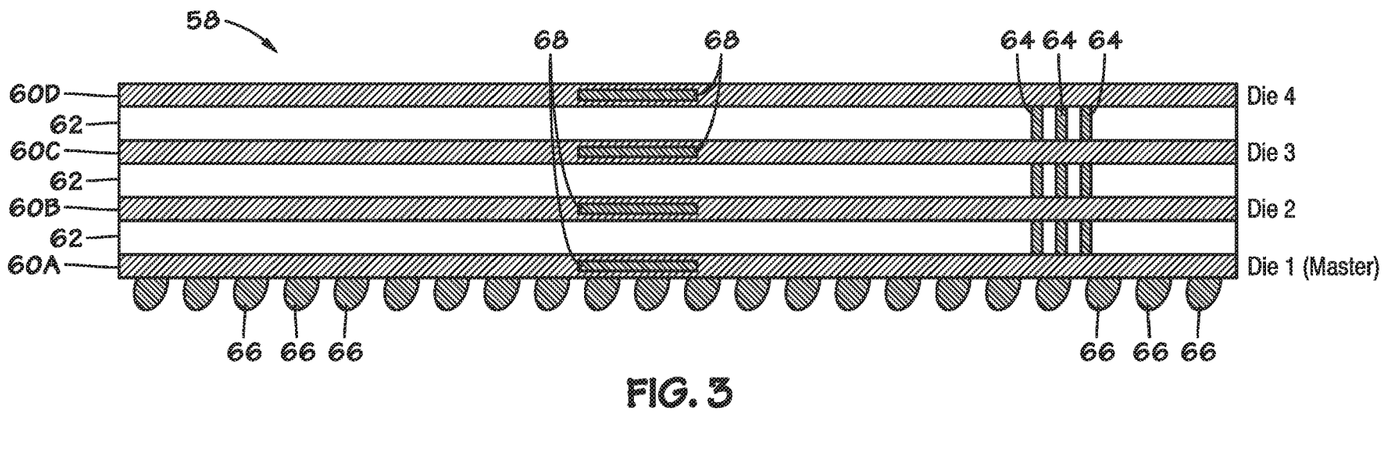
FIG. 3 is a partial cross-sectional view of a memory die stack, in accordance with an embodiment of the present disclosure.

In some embodiments, the memory banks 32 and/or bank controllers 54 may be included on one or more die stacks 58, shown in FIG. 3. As mentioned above, 3-dimensional stacking (3DS) may be implemented when one or more die 60 are layered together. 3DS may allow for more efficient use of space and/or improve operational characteristics (e.g., speed, energy consumption, etc.) in memory devices 14. Although shown with 4 die 60, the die stack 58 may have more or less die 60 depending on the implementation. Each die 60 may be separated by a non-conducting layer 62 to prevent unwanted interference (e.g., electromagnetic interference, voltage arching, etc.) from one die 60 to another. Each die 60 may be connected and communicate using though silicon vias (TSVs) 64. Each die stack 58 implementing 3DS may also include a master die 60A. The master die 60A may include on-die connections 66 (e.g., solder joints or other printed circuit board (PCB) connections) to communicate with other devices on the memory device 14, the controller 12, and/or other devices of the computer system 10. In some embodiments, each of the other die 60B, 60C, and 60D may communicate through the master die 60A instead of individual connections 66 to each die 60. As such, the master die 60A may control the operation of other die 60B, 60C, and 60D in the die stack 58. For example, the master die 60A may include mode registers such as one providing die temperatures, or an indication of die temperatures, to a memory controller. As stated above, the memory controller may be located on the memory device 14 (e.g., the bank control 54) or on a separate controller 12.

As stated above, the temperature of the die 60 may affect the operation of the memory device 14, for example, by increasing or decreasing leakage from the memory cells. As such, the refresh rate of the die stack 58 may be set based at least partially on the temperature of the die stack 58. It may be desirable to operate the memory device 14 at a low refresh rate to decrease power consumption as well as reduce delays due to the refresh. As such, it may be desirable to know the temperature of each die 60, in order to operate at the optimal refresh rate while still maintaining memory cell integrity. Each die 60 may, therefore, include a temperature sensor 68. Such an on-die temperature sensor 68 may be external to the die 60 or integrated within the die 60, and may be a silicon band-gap temperature sensor or any other temperature sensor 68 suitable for use with the die stack 58.

In some embodiments, the output of each temperature sensor 68 of the multiple die 60 may be connected to a mode register for periodic reading. The mode register may then provide the temperature to a memory controller to control the refresh rate. However, connecting the temperature sensors 68 of each die 60 to a mode register may take up valuable real estate and/or bandwidth on the die 60. As such, the temperature reading may be made using just the temperature of the master die 60A, since generally the master die 60A is the hottest die 60. However, in some instances, the master die 60A may not be the hottest die in the die stack 58, and basing the refresh rate on the master die 60A may lead to errors on the actual hottest die (e.g., die 60B, 60B, or 60C). As such, in accordance with the present embodiment, the die stack 58 may pass the temperature of each die 60 down the TSVs 64 retaining just the hottest temperature.

Figure 4:
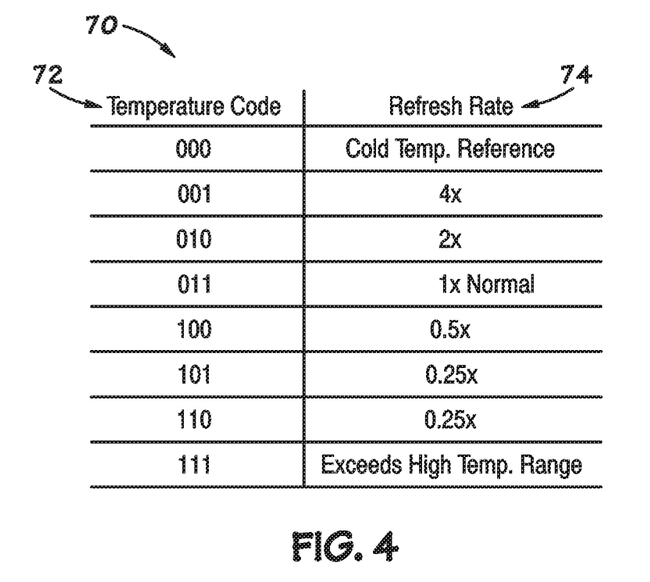
FIG. 4 is a table of example temperature codes and corresponding refresh rates, in accordance with an embodiment of the present disclosure.

In some embodiments, the signal from the temperature sensor 68 may be indicative of a temperature range in which a die 60 is operating. FIG. 4 shows a table 70 illustrating example temperature codes 72 that may be passed between die 60 and supplied to the mode register. In the illustrated embodiment, the temperature code 72 may be a 3-bit code defining temperature brackets. Alternatively, the temperature codes 72 may indicate a more precise measurement such as the temperature itself and/or have more or fewer bits depending on the level of precision desired in the application. The table 70 also shows example refresh rates 74 corresponding to the temperature codes 72.

In some embodiments, the refresh rate of a memory device 14 may have an interval of approximately 64 milliseconds (ms). Depending on the number of wordlines in a memory bank 32, for example, a DDR5 memory device 12 may have 16,384 wordlines per memory bank 32; this may correspond to an approximately 3.8 microsecond (µs) refresh per wordline if utilizing a distributed refresh policy. If using a burst refresh policy, the entire memory bank 32 may be refreshed at once every 64 ms. As stated above, it may be desirable to refresh hotter die 60 more often, while cooler die 60 may be refreshed less often. For example, a temperature code 72 of 001 may indicate a relatively cold operating temperature compared to the standard. This colder operating temperature may allow the die stack 58 to operate at a reduced refresh rate 74. For example, the time between refreshes may be four times longer than the standard (e.g., 4×64 ms=256 ms). Likewise, a temperature code 72 of 110 may indicate a hotter than normal temperature corresponding to an increased refresh rate 74 such as one quarter the standard refresh time (e.g., ¼×64 ms=16 ms). As such, temperature codes 72 between these temperature ranges may operate at refresh rates 74 corresponding to the hottest temperature in the die stack 58. Additionally, reference codes may also be used, for example, bit code 000 may indicate a cold temperature reference from which to compare the temperature code 72. Furthermore, a temperature code 72 may also indicate an abnormally high temperature. For example, a temperature code 72 of 111 may indicate that the temperature range is out of optimal range and/or that errors may occur. As will be appreciated, multiple temperature codes 72 of different bit length, different temperature ranges, and/or actual temperature readings may be used along with multiple different refresh rates 74.

Figure 5:
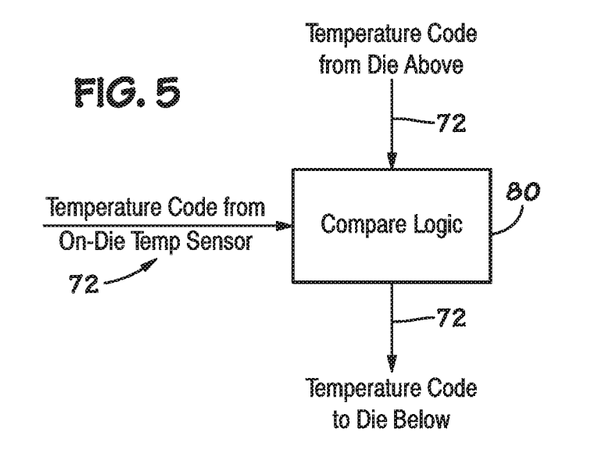
FIG. 5 is a block diagram of compare logic, in accordance with an embodiment of the present disclosure.
Figure 6:
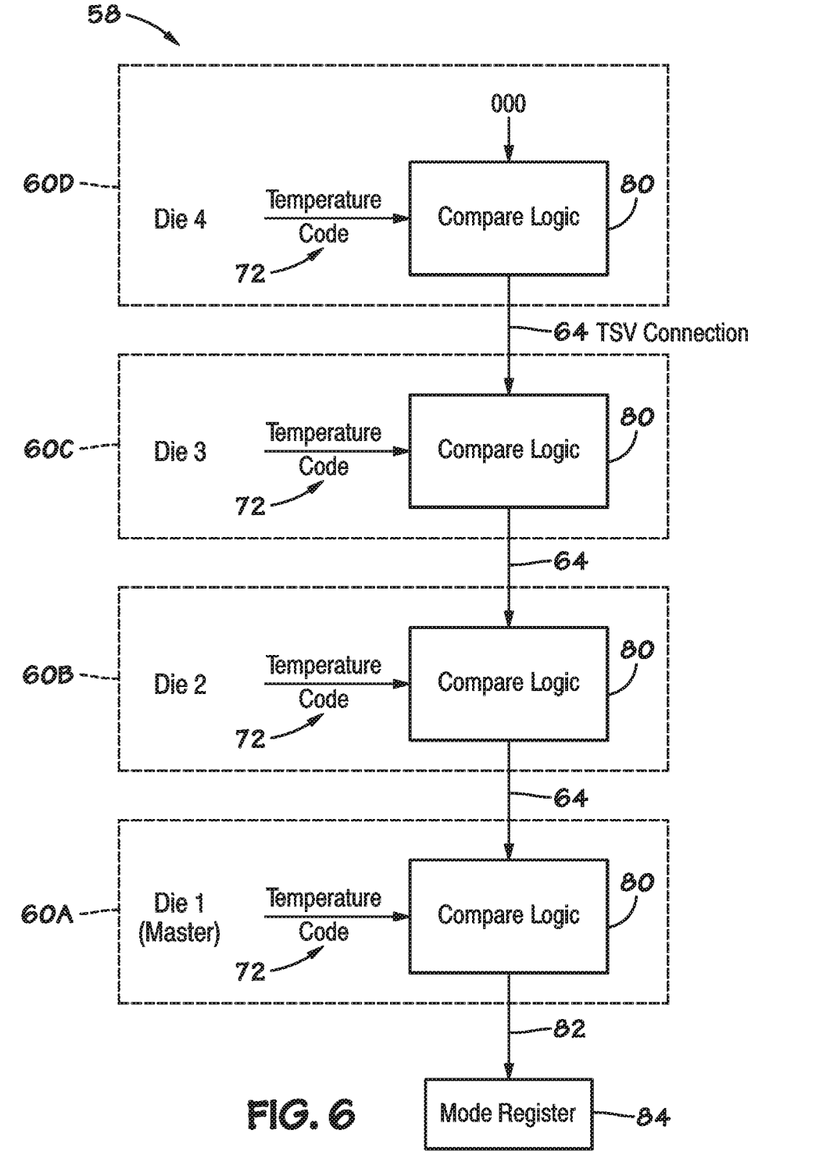
FIG. 6 is a block diagram of a die stack including multiple compare logic blocks, in accordance with an embodiment of the present disclosure.

Instead of carrying every temperature code 72 down the TSVs 64 to the master die 60A, each die 60 may have compare logic 80 to determine the hotter of two or more temperature codes 72, as shown in FIG. 5. Each compare logic 80 may take the temperature code 72 from the previous die 60 and output the bit code corresponding to the hottest temperature code 72 to the next die 60. As shown in FIG. 6, this may continue until the master die 60A is reached, at which point the hottest temperature code 72 of the die stack 58 may be provided as an output 82 to the mode register 84 (e.g., a mode register on the master die 60A). The output 82 may then be read from the mode register 84 to provide an indication corresponding the hottest die 60 in the die stack 58. Advantageously, the optimal refresh rate 74 of the die stack 58 (based on the temperature) may be determined by utilizing a single read of a single mode register 84.

Each die 60 may include the compare logic 80 to maintain consistency among die 60 when manufacturing. However, since there may be no die above the top die 60D, the compare logic 80 may compare the temperature code 72 to a cold temperature reference code (e.g., 000) which may, by default, cause the output of the compare logic 80 to be the temperature code 72 of the top die 60D. In some embodiments, the temperature code 72 may include an identifier for which die 60 the temperature code 72 originated. Instead of comparing the temperature code 72 of the top die 60D to a cold temperature reference, the identifier for the top die 60D may cause the compare logic 80 to be used as a pass through or simply not used. Additionally, one or more die 60 (e.g., the top die 60D), may also be implemented without compare logic 80 in some embodiments. Furthermore, the temperature codes 72 of multiple die 60 may compared at once using a single compare logic 80.

Figure 7:
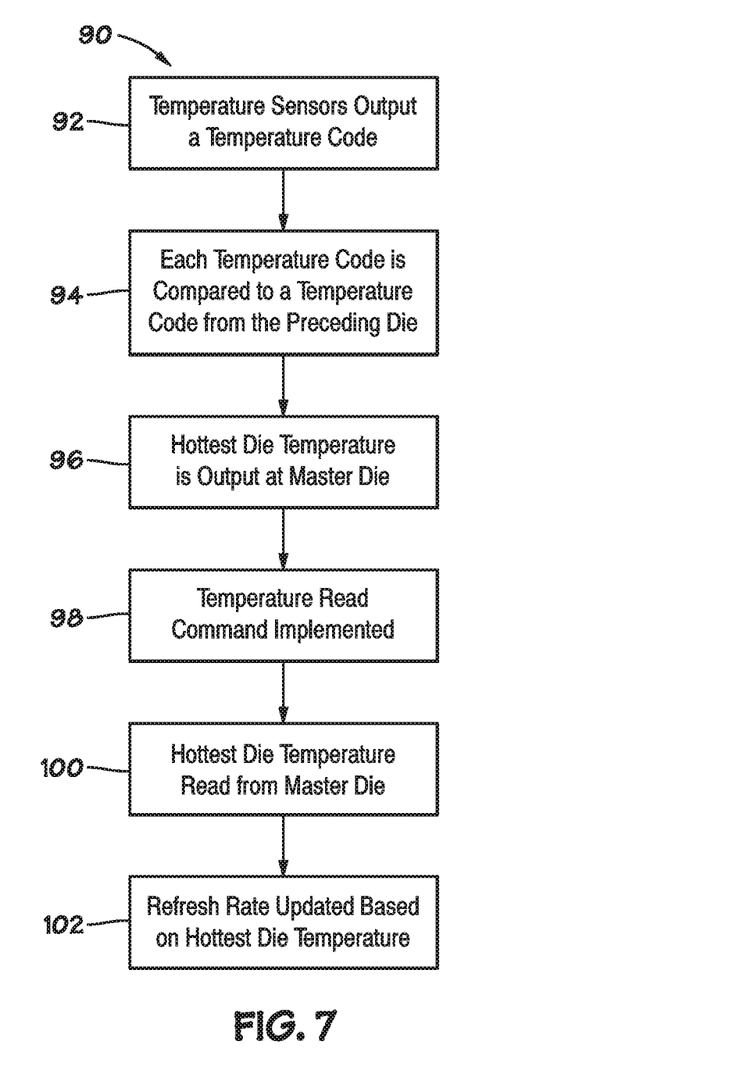
FIG. 7 is a flowchart illustrating a method for reading the hottest temperature of a die stack and updating the refresh rate accordingly, in accordance with another embodiment of the present disclosure.

In one embodiment, illustrated by a flowchart 90 in FIG. 7, a method for obtaining the hottest temperature of the die stack 58 may be used to update the refresh rate. Each temperature sensor 68 may periodically or constantly output a temperature code 72 (process block 92). Each temperature code 72 may then be compared to a temperature code 72 from the preceding die 60, such as a die 60 located directly above and adjacent to the die 60 (process block 94). During each comparison, the hottest of the two temperature codes 72 may be passed on to the next die 60 for further comparison. The temperature code 72 of the hottest die 60 in the die stack 58 is then available as an output 82 on the master die 60A (process block 96) to be stored in a mode register 84 on the master die 60A. Periodically or continuously, a temperature read command may be implemented on the mode register 84 (process block 98) causing the hottest die temperature to be read from the master die 60A (process block 100). The refresh rate 74 may then be updated based at least in part on the temperature code 72 received by the mode register 84 corresponding the hottest die temperature of the die stack 58. The mode register 84 may be a read-only or read/write mode register 84. Although the flowchart 90 is depicted in a particular order, in certain embodiments, steps may be reordered, altered, deleted, repeated, and/or occur simultaneously.

As stated above, the memory controller (e.g., controller 12, bank control 54, an on-die controller, etc.) may initiate a temperature read command and/or initiate the temperature sensing and comparison steps of the method 90 to adjust the refresh rate 74 of the memory device 14. This temperature read command and refresh rate update may be done at any suitable interval depending on the implementation of the memory device 14. For example, the temperature read command and refresh rate update may occur at the current refresh rate interval, a fixed interval (e.g., 64 ms, 1 second (s), 2 s, 5 s, 1 minute, etc.), or a variable interval based on the temperature readings or user settings.

The temperature readings may also be used to effect other operational settings and/or features of the memory device 14. For example, if the die stack 58 is determined to be hotter than a threshold, the memory device may be turned off to prevent errors or physical issues due to overheating. Additionally, the temperature readings may be stored and analyzed for trend data. The trend data may be used when determining the refresh rate and/or the periodicity of temperature read commands. Additionally, the temperature readings and/or trend data may be used to ramp up or down the clock rate of the memory device 14. This may be done to optimize speed, efficiency, heat, or other desired parameter.

As such, a die stack 58 may include multiple die 60 each including a temperature sensor 68. Compare logic 80 on each die 60 may output the hottest temperature code 72 of the present and preceding die 60 to the next lower die 60 in the die stack 58. The bottom die 60 (e.g., the master die 60A) may output a temperature code 72 corresponding to the hottest die temperature of the die stack 58 to a mode register 84 to be read for updating operating parameters (e.g., refresh rate 74) of the memory device 14.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
a memory array comprising a plurality of memory cells, wherein the memory device comprises a double data rate type five synchronous dynamic random access memory (DDR5 SDRAM);
a die stack comprising at least a portion of the plurality of memory cells; and
a plurality of temperature sensors each configured to output a temperature code corresponding to the temperature of a respective die of the die stack, wherein a first die of the die stack comprises compare logic configured to compare the temperature code of the first die of the die stack to the temperature code of a second die of the die stack and to output the temperature code corresponding to the hottest die between the first die and the second die based on the comparison, and wherein one die of the die stack is configured to output the temperature code corresponding to the hottest die of the die stack.

2. The memory device of claim 1, wherein the plurality of temperature sensors are on-die temperature sensors.

3. The memory device of claim 1, wherein each die of the die stack has a separate temperature sensor.

4. The memory device of claim 1, wherein the temperature code of the first die of the die stack is communicated to the second die by a through silicon via (TSV).

5. The memory device of claim 1, wherein the temperature code corresponding to the hottest die between the first die and the second die is communicated to the compare logic of a third die of the die stack for comparison to the temperature code of the third die.

6. The memory device of claim 1, wherein the temperature code corresponding to the hottest die of the die stack is output to a mode register of a master die of the die stack.

7. The memory device of claim 6, wherein the mode register is configured to be read and output the temperature code of the hottest die of the die stack for use in designating a refresh rate of the memory device.

8. The memory device of claim 7, wherein the refresh rate of the memory device is increased in response to the temperature code of the hottest die of the die stack increasing beyond a threshold temperature.

9. The memory device of claim 1, wherein the temperature code is representative of a temperature range.

10. The memory device of claim 1, wherein the die stack comprises 4 die.

11. The memory device of claim 1, comprising a plurality of die stacks.

\* \* \* \* \*